United States Patent [19]

Wilson et al.

[11] Patent Number: 4,717,588
[45] Date of Patent: Jan. 5, 1988

[54] METAL REDISTRIBUTION BY RAPID THERMAL PROCESSING

[75] Inventors: Syd R. Wilson, Phoenix; Wayne M. Paulson, Paradise Valley; Charles J. Varker, Scottsdale, all of Ariz.

[73] Assignee: Motorola Inc., Schaumburg, Ill.

[21] Appl. No.: 812,557

[22] Filed: Dec. 23, 1985

[51] Int. Cl.⁴ .............................................. B05D 3/14
[52] U.S. Cl. ............................ 427/51; 148/DIG. 37; 148/DIG. 62
[58] Field of Search ...................... 427/85, 51; 29/582; 148/DIG. 71, DIG. 62, DIG. 35, DIG. 37, DIG. 4, DIG. 40; 357/64

[56] References Cited

U.S. PATENT DOCUMENTS

| | | | |
|---|---|---|---|
| 3,342,651 | 9/1967 | Raithel | 148/DIG. 62 |
| 3,445,736 | 5/1969 | Navon | 148/DIG. 62 |
| 3,473,976 | 10/1969 | Castrucci | 148/DIG. 62 |
| 3,485,684 | 12/1969 | Mann | 148/DIG. 62 |
| 3,617,398 | 11/1971 | Bilous | 148/DIG. 62 |
| 3,655,457 | 4/1972 | Duffy | 148/DIG. 62 |
| 4,290,188 | 9/1981 | Ichinose | 357/64 |
| 4,417,347 | 11/1983 | Muka | 427/55 |
| 4,474,831 | 10/1984 | Downey | 427/55 |
| 4,503,087 | 3/1985 | Russo | 427/55 |

OTHER PUBLICATIONS

D. F. Downey, C. J. Russo, J. T. White, "Activation and Process Characteristics of Infrared Rapid Isothermal and Furnace Annealing Techniques", Solid State Technology, Sep. 1982, pp. 87-93.

Primary Examiner—Sam Silverberg
Assistant Examiner—Vi Duong Dang
Attorney, Agent, or Firm—Joe E. Barbee

[57] ABSTRACT

A method for diffusing a metal dopant into a semiconductor switching device is provided by the use of a rapid thermal heating apparatus. This method provides a procedure for the selectively placing of a metal dopant in a region of the device or circuit. This aids in increasing the manufacturing yields of the switching device, and increases the number of active traps for minority carriers.

10 Claims, 6 Drawing Figures

METAL REDISTRIBUTION BY RAPID THERMAL PROCESSING

BACKGROUND OF THE INVENTION

This invention relates, in general, to semiconductor devices, and more particularly to a method of fabricating high switching speed diodes and transistors in which the manufacturing yields are improved.

It is known that doping semiconductor devices with near mid band-gap life-time killing impurities results in faster excess carrier recombination during turn-off of the device such that the switching speed is correspondingly increased. Gold and platinum, for example, are used as impurities or dopants and act as a trap for minority carriers which results in increasing the switching speed of a diode or a transistor.

Typically, high speed switching transistors are fabricated by manufacturing a transistor on one side of a silicon wafer and depositing the metal dopant on the other side. The metal dopant, for example gold, is driven into the transistor by placing the wafers into a furnace tube with a temperature of approximately 950 degrees Celsius for about 30 minutes. In order to achieve high switching speeds, it is important that the gold is evenly distributed through the base region. To accomplish this, the gold is evenly distributed throughout the emitter, base and collector regions. However, it is a well known fact that gold would rather segregate to the N-type regions than the P-type regions as the wafer cools. It is for this reason that when the wafers are withdrawn from the furnace tube, the wafers are subjected to a vapor from liquid nitrogen. The vapor quick cools the wafer and prevents the gold from migrating out of the P− base region and into the N+ emitter region and the N-type collector region. Unfortunately, the high furnace temperature followed by the fast cool down cycle causes many of the wafers to break or warp. This is due to the nonuniform cool down cycle which creates thermal stress within the wafer.

SUMMARY OF THE INVENTION

Accordingly, it is an object of the present invention to provide a method for improving the yield in the manufacturing of high speed switching devices.

Another object of this invention is to decrease or eliminate rejected devices due to broken or warped wafers.

An additional object is to decrease or eliminate rejected devices due to improper device characteristics.

A further object of the present invention is to provide a method for the selective placing of a metal dopant to optimize the switching properties of selected components within a circuit.

The foregoing and other objects and advantages are achieved in the present invention which, as part thereof, comprises forming a device on one side of a silicon substrate, depositing a layer of a metal dopant on the other side of the silicon substrate, capping the front and the back of the substrate with a layer of oxide, diffusing the metal dopant into the substrate by a rapid heating apparatus, and cooling the substrate both rapidly and uniformly.

DETAILED DESCRIPTION OF THE INVENTION

Figure 1:
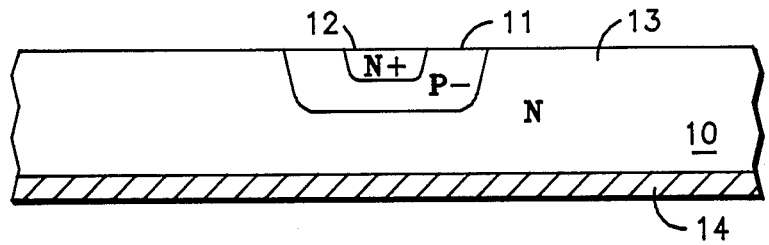
FIG. 1 is an enlarged sectional view illustrating a portion of a semiconductor switching device fabricated in accordance with one embodiment of the present invention.
Figure 2:
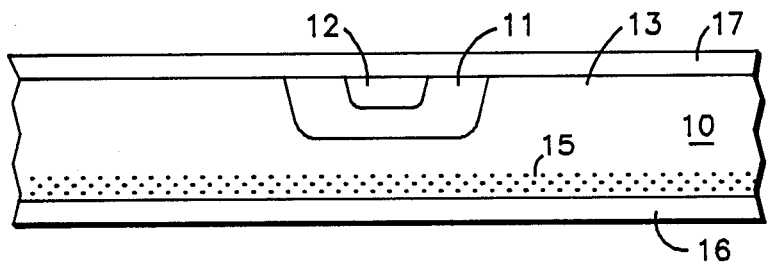
FIG. 2 is an enlarged sectional view of the device in FIG. 1 after the substrate has been capped on the top and bottom with oxide.
Figure 3:
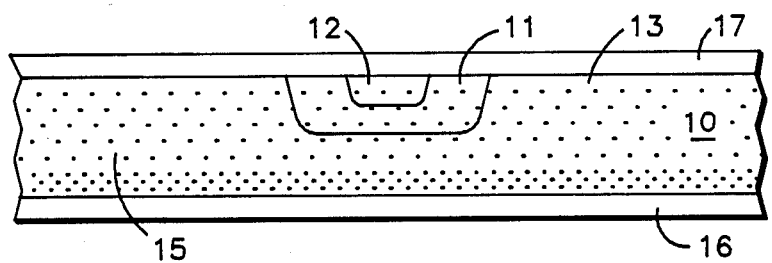
FIG. 3 is an enlarged sectional view of the device in FIG. 2 after the metal dopant has been diffused throughout the substrate and device.

The sectional views of FIGS. 1-3 represents a portion of a semiconductor switching device fabricated with one embodiment of the present invention. In FIG. 1, substrate 10 is an N-type silicon substrate and acts as collector 13 for the device. Base 11 is a P-type region made by diffusing a P-type impurity, such as boron, into substrate 10. Emitter 12 is a N-type region made by diffusing a N-type impurity, such as phosphorous, into base region 11. Metal layer 14 is a layer of gold that is deposited to a thickness of approximately 60 nanometers (nm). Some other examples of metals that may be used as a life-time killer include platinum, silver, nickel, copper, iron, chromium, titanium, vanadium, manganese, and palladium.

FIG. 2 illustrates the switching device of FIG. 1 after capping the front and back of substrate 10 with a layer of oxide, such as chemical vapor deposition (CVD) silicon dioxide. Oxide layers 16 and 17 may be 10 nm to 1000 nm thick and are used to prevent the gold from leaving the substrate and contaminating the heating apparatus. The 450 degree temperature that is used to form oxide layers 16 and 17 causes metal layer 14 to be alloyed into substrate 10, as shown by 15.

FIG. 3 illustrates the switching device of FIG. 2 after metal dopant 15 is diffused into collector 13, base 11 and emitter 12. Using a Varian model IA-200 rapid heating apparatus, the gold is diffused by heating the device to a temperature in the range of 900 to 1350 degrees Celsius, preferably, 1150 degrees Celsius. A typical time for rapid heating substrate 10 would be for 30 seconds with a range of 15 to 120 seconds. The design characteristics of the Varian rapid heater, like other rapid heaters, allows the substrate to be uniformly or isothermally heated in seconds and to quickly cool down without warping or breaking the substrate. The rapid cooling of the device is necessary to keep the diffused gold in base region 11. In the example using the Varian heater, the rapid drop in temperature is achieved because substrate 10 is not in contact with any mass that may retain heat, such as other substrates or quartz boats. Once a shutter inside the heater closes, the temperature drops approximately 100 degrees Celsius per second. This rapid cooling minimizes the migration of gold into the N-type regions and out of the P-type region.

In a variation of the above embodiment, the device of FIG. 1 is fabricated by duplicating the steps as described in FIGS. 1 and 2, and then diffusing the gold by placing the device in a furnace. The device is heated in a furnace for approximately 30 minutes at a temperature of 950 degrees Celsius. After the gold is diffused throughout the wafer, the device is then spike annealed by a rapid heating apparatus for 1 to 20 seconds at a temperature in the range of 900 to 1350 degrees Celsius. The wafer is then rapidly cooled. The rapid cooling retains a higher concentration of gold traps and insures that the metal dopant is evenly distributed throughout base region 11.

Figure 4:
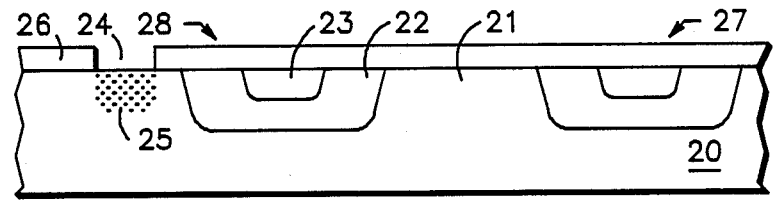
FIGS. 4 and 5 illustrate another embodiment of the invention in which a metal dopant is selectively placed on top of the substrate next to a switching device, follow by a rapid heating step to distribute the metal dopant.
Figure 5:
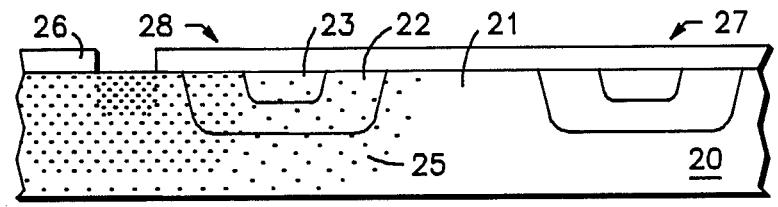

Another embodiment of this invention is illustrated in FIGS. 4 and 5. In FIG. 4, opening 24 is formed in oxide layer 26 using masking and etching techniques known in the art. Substrate 20 is an N-type silicon substrate and acts as collector 21 for switching device 28. Base 22 is a P-type region made by diffusing a P-type impurity, such as boron, into substrate 20. Emitter 23 is a N-type region made by diffusing a N-type impurity, such as phosphorous, into base region 22. Device 27 may be a power device or some other type of device that will be used in the same circuitry as switching device 28. Metal dopant 25 is selectively deposited through opening 24 into substrate 20 using techniques known in the art such as ion implantation, or metal evaporation. Device 27 is protected from the metal dopant by oxide layer 26.

FIG. 5 illustrates the switching device of FIG. 4 after metal dopant 25 is diffused through collector 21, base 22 and emitter 23. Metal dopant 25 is diffused by heating the device with a rapid heating apparatus for 1 to 30 seconds. The device is then rapidly and uniformly cooled at a rate of at least 100 degrees Celsius per second. A unique advantage of this invention is that the short time at temperature and the fast cooling allows precise control of the metal dopant diffusion, therefore, metal dopant 25 is not diffused into device 27.

Figure 6:
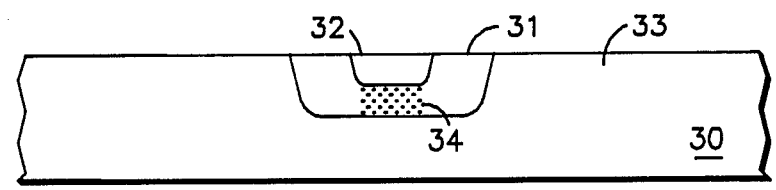
FIG. 6 illustrates a further embodiment of the invention in which a focused ion beam is used to implant the metal dopant into select regions followed by a rapid heating step.

A further embodiment of this invention is illustrated in FIG. 6. Substrate 30 is an N-type silicon substrate and acts as collector 33 for the device. Base 31 is a P-type region made by diffusing a P-type impurity, such as boron, into substrate 30. Emitter 32 is a N-type region made by diffusing a N-type impurity, such as phosphorous, into base region 31. Metal dopant 34 is selectively implanted into base 31 by using a focused ion beam implanter. This implanter is a direct write or maskless type implanter which implants the metal dopant directly into base 31. Using a rapid heating apparatus, metal dopant 34 is put into solution by heating the device for 1 to 10 seconds. The temperature is in the range of 900 to 1350 degrees Celsius. To keep metal dopant 34 within base region 31, the device must be uniformly cooled at a rate of at least 100 degrees Celsius per second. One advantage to this embodiment included the ability to localize the metal dopant within a select region which allows the high speed switching device to be placed within the same circuit with other devices. Another advantage would be the increase in switching speed due to the localized placing of the metal dopant in the base region without diffusing any dopant into the emitter or collector regions.

Thus, it is apparent that there has been provided an improved method for diffusing a metal dopant into a semiconductor switching device. This is accomplished in part with the use of a rapid heating apparatus, which also rapidly cools, and a device formed on a silicon substrate.

Having described the invention, it will be apparent to those skilled in the art that various modifications can be made within the spirit and scope of the present invention. For example, oxide layers 16 and 17 of FIGS. 2 and 3 can be of some other type of dielectric such as silicon nitride.

We claim:

1. A method for fabricating a semiconductor device, comprising:
   forming a transistor on the front side of a silicon substrate;
   depositing a layer of a metal dopant on the back side of the silicon substrate;
   capping the front and the back of the substrate with a layer of deposited oxide;
   diffusing the metal dopant into the transistor with a rapid heating apparatus; and
   rapidly cooling the device in a uniform manner.

2. The method as defined in claim 1, in which the temperature of the rapid heating apparatus is in the range of 900 to 1350 degrees Celsius in a time period of 15 to 120 seconds.

3. A method for fabricating a semiconductor device, comprising:
   forming a transistor on the front side of a silicon substrate;
   depositing a layer of a metal dopant on the back side of the silicon substrate;
   capping the front and the back of the substrate with a layer of deposited oxide;
   diffusing the metal dopant into the transistor with a furnace;
   spiking the device with a rapid heating apparatus; and
   cooling the device rapidly and uniformly.

4. The method as defined in claim 3, in which the time for the spiking of the device is in the range of 1 to 20 seconds.

5. A method for fabricating a semiconductor switching device, comprising:
   forming the device on a silicon substrate;
   forming an oxide layer over the device;
   forming an opening in the oxide next to the device;
   implanting a metal dopant into the substrate through the opening;
   diffusing the metal dopant throughout the device by heating the device with a rapid heating apparatus; and
   cooling the device rapidly and uniformly.

6. The method as defined in claim 5, in which the metal dopant is selected from the group consisting of gold, platinum, iron, silver, nickel, copper, chromium, titanium, vanadium, manganese, and palladium.

7. A method for fabricating a semiconductor switching device, comprising:
   forming the device on a substrate;
   implanting a metal dopant into a select region in the device using a focused ion beam implanter;
   heating the device with a rapid heating apparatus to put the metal dopant into solution; and
   cooling the device rapidly and uniformly.

8. The method as defined in claim 7, in which the metal dopant is selected from the group consisting of gold, platinum, iron, silver, nickel, copper, chromium, titanium, vanadium, manganese, and palladium.

9. The method as defined in claim 7, in which the temperature of the rapid heating apparatus is in the range of 900 to 1350 degrees Celsius for a time period of 1 to 10 seconds.

10. A method for fabricating a semiconductor circuit, comprising:
    forming a plurality of devices on a silicon substrate, wherein at least one device is a switching device;

forming an oxide layer over the plurality of devices;
forming an opening in the oxide next to the switching device;
depositing a metal dopant into the substrate through the opening;
diffusing the metal dopant throughout the switching device by heating the substrate with a rapid heating apparatus; and
cooling the substrate rapidly and uniformly.

* * * * *